United States Patent [19]
Payne

[11] Patent Number: 5,936,880
[45] Date of Patent: Aug. 10, 1999

[54] BI-LAYER PROGRAMMABLE RESISTOR MEMORY

[75] Inventor: Robert L. Payne, San Jose, Calif.

[73] Assignee: VLSI Technology, Inc., San Jose, Calif.

[21] Appl. No.: 08/969,567

[22] Filed: Nov. 13, 1997

[51] Int. Cl.[6] ............................. G11C 17/00; G11C 17/14
[52] U.S. Cl. ......................... 365/148; 365/100; 365/104; 365/177
[58] Field of Search .................................... 365/148, 177, 365/210, 103, 104, 100

[56] References Cited

U.S. PATENT DOCUMENTS

| | | | |
|---|---|---|---|
| 4,037,218 | 7/1977 | Groeger | 365/148 |
| 4,070,653 | 1/1978 | Rao | 365/148 |
| 4,583,201 | 4/1986 | Bertin | 365/104 |
| 5,119,329 | 6/1992 | Evans | 365/100 |
| 5,761,110 | 6/1998 | Irrinki | 365/100 |

Primary Examiner—Son Mai
Attorney, Agent, or Firm—Burns, Doane, Swecker & Mathis LLP

[57] ABSTRACT

A static, in-circuit programmable memory device is provided where the storage element employed is a bi-layer programmable resistor. A specialized programming and readout circuit is provided for each storage element, allowing a known word-line/bit-line memory architecture (commonly used with fuse type memories) to be adapted to a memory element that conducts in both of two different states. The programming and readout circuit may take the form of a merged bipolar/FET device. A bipolar transistor is used for programming and also provides a diode action to prevent sneak path currents from flowing when a storage element is not selected. The bipolar transistor may be a parasitic bipolar transistor. An FET is used for readout. Storage elements are paired, one storage element of each pair functioning as a reference element. The bit lines of the paired storage elements are connected to a current mirror circuit that effects a comparison between current through the reference element and current through its paired storage element. Reliable readout is thereby attained.

13 Claims, 4 Drawing Sheets

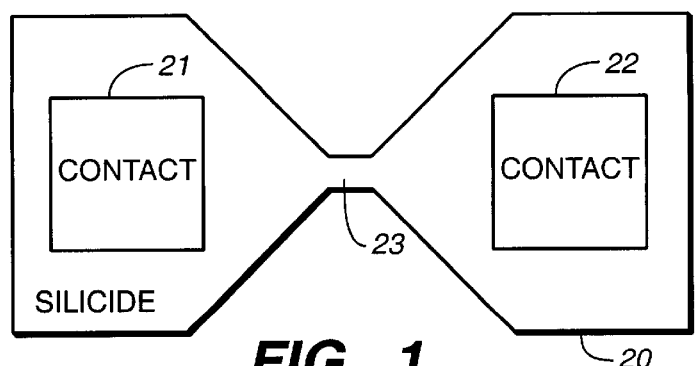
FIG._1
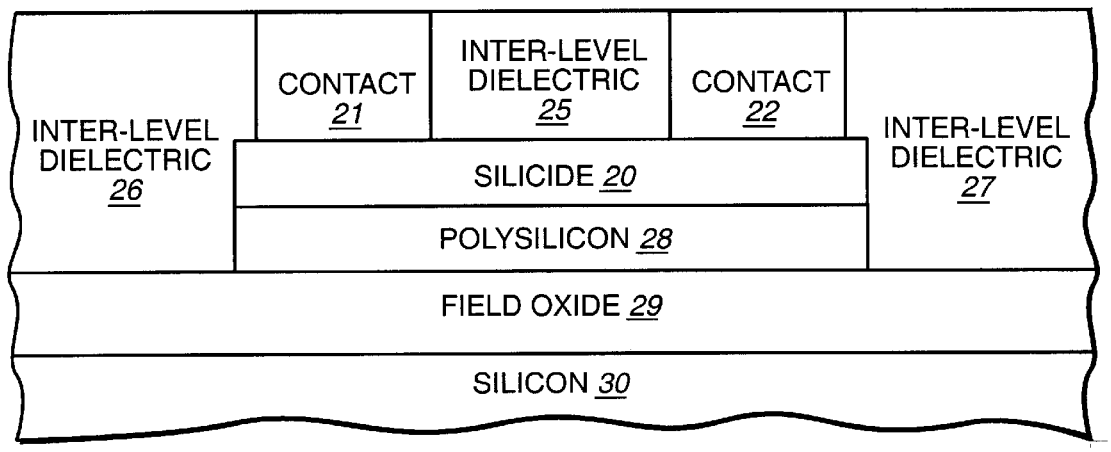
FIG._2
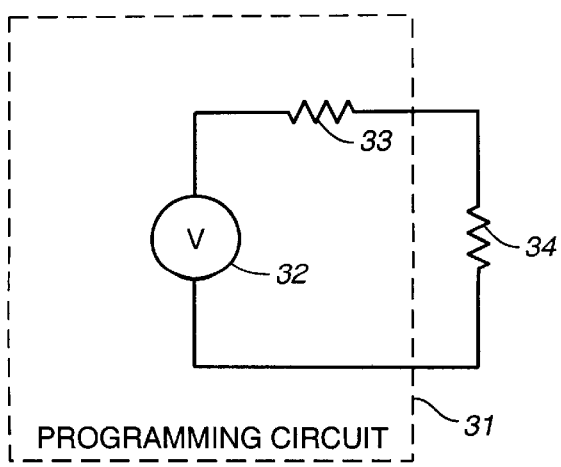
FIG._3
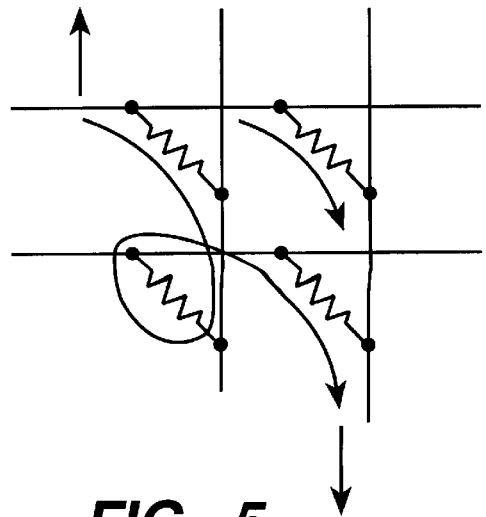
FIG._5

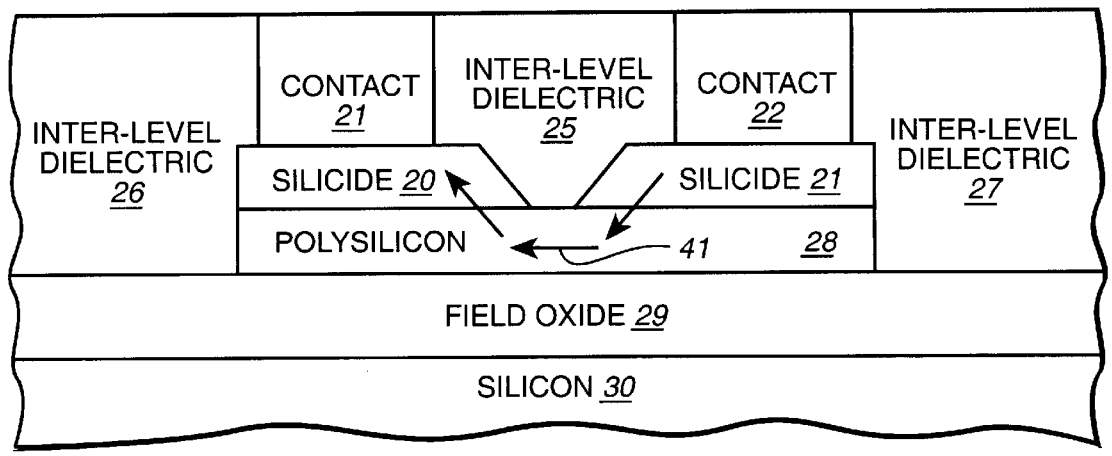
FIG._4
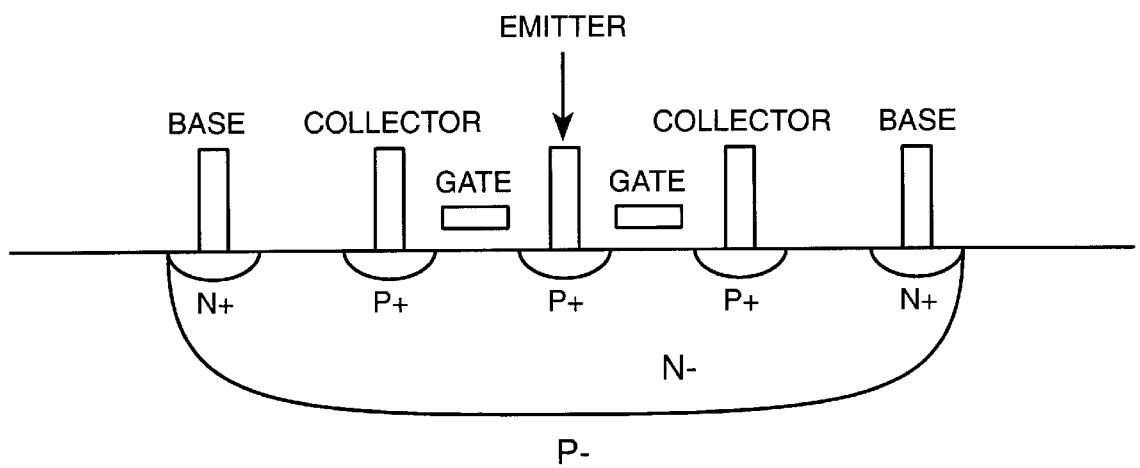
FIG._7
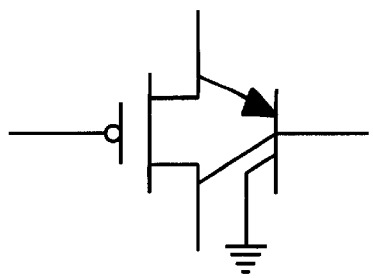
FIG._8

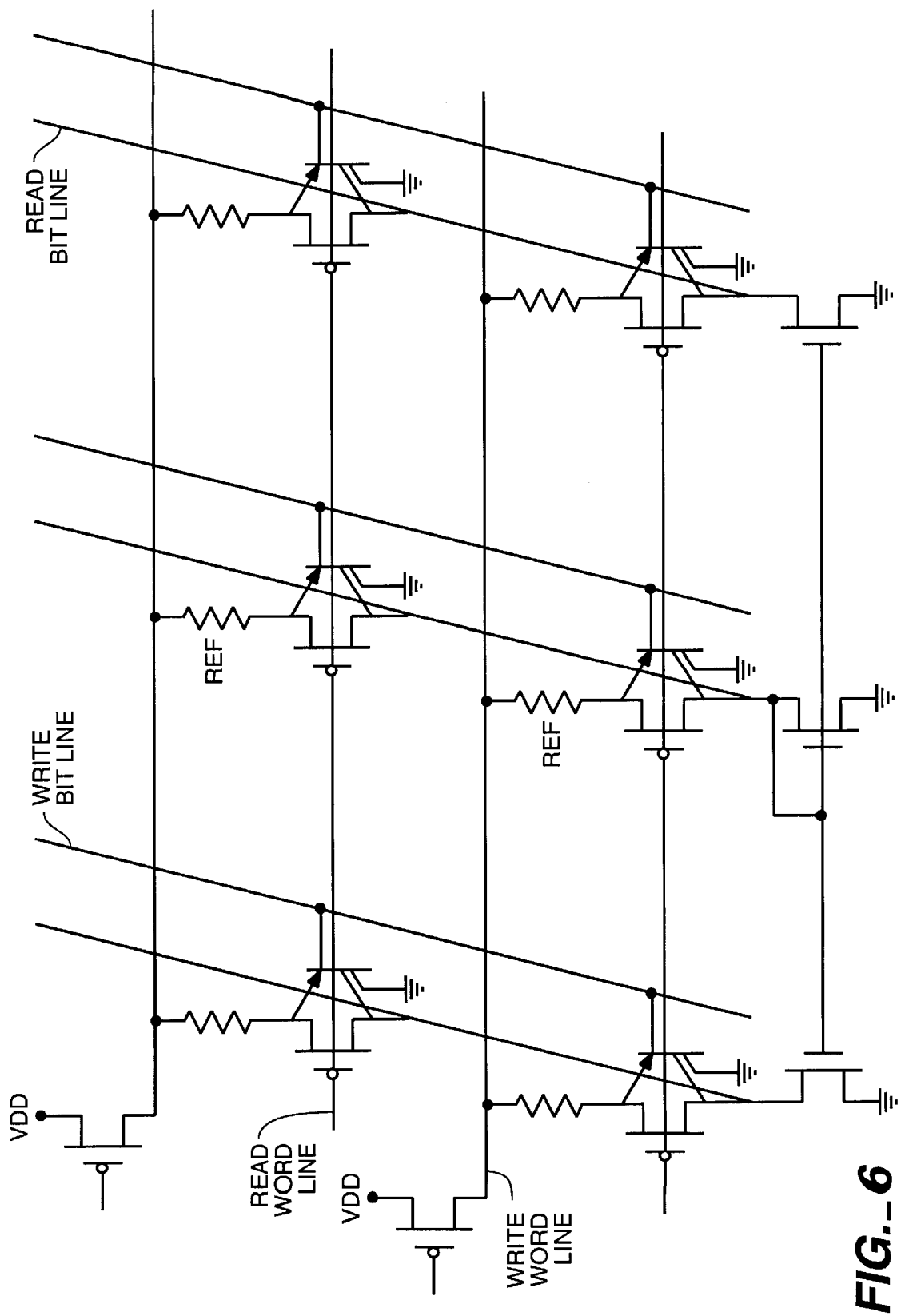
FIG._6

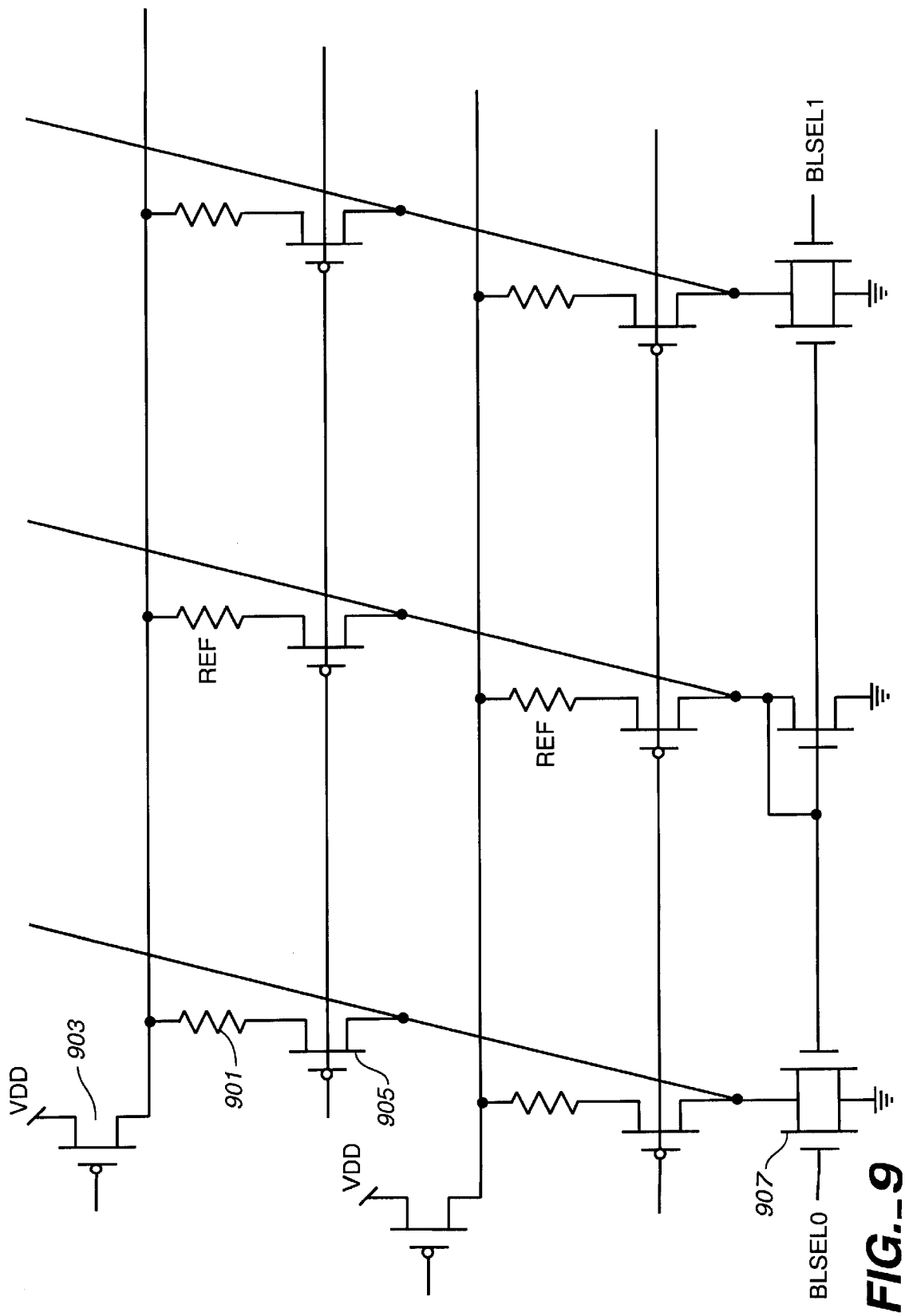
FIG._9

BI-LAYER PROGRAMMABLE RESISTOR MEMORY

BACKGROUND OF THE INVENTION

1. Field of the Invention

The present invention relates to static memory devices, in particular in-circuit programmable static memory devices.

2. State of the Art

There are a significant number of integrated circuit applications that require some sort of electrically programmable memory within the integrated circuit chip. These applications include, for example, applications which require several bits of programmable memory (e.g., programming identification numbers), to applications which require several megabits of programmable memory (e.g., storing operating code).

In the prior art, a wide variety of technologies have been used for implementing programmable memory within integrated circuits. For example, these include floating-gate non-volatile memories and anti-fuses.

One problem with most prior art approaches to providing programmable memory is that extra wafer processing is required to implement them. This increases the production cost. The extra wafer processing is particularly difficult to justify when only relatively small amounts of electrically programmable memory are required on each integrated circuit. It is very advantageous to identify a programmable element that could be produced within the baseline logic integrated circuit process, thus eliminating any additional wafer processing cost.

There have been some attempts to develop programmable elements that can be produced within the baseline logic integrated circuit process. One such "zero-cost" approach that has been used in the past is to create a fuse out of the existing polysilicon or metal layers, and then "blow" the fuse by passing a large programming current. The dissipated heat causes local melting and vaporization of the fuse material, causing the fuse to transition from a relatively low resistance to an open circuit.

There are several significant problems that limit the applicability of the prior art polysilicon or metal fuses. The most fundamental problem is the damage that takes place when the fuse is blown. The blowing of the fuse is usually associated with vaporization of the fuse material, leading to catastrophic rupture of any layers of dielectric or metal that would normally be on top of the fuse in a conventional integrated circuit process. The rupture of the overlying layers represents a significant reliability hazard, as it may cause circuit malfunction directly, or by allowing external contaminants to gain ingress to the integrated circuit. The most common approach to this problem is to create a "passivation opening" over the top of the fuse to ensure that there are no overlying layers present. In this way any vaporized metal can escape readily without creating damage. The problem with this approach is that the pad opening destroys the integrity of the overlying "passivation" layer on the die, and so will allow external contaminants to enter the die and cause long-term reliability problems. In practice, when "passivation openings" are used, it is necessary to package the finished product in an expensive "hermetic" package. The package itself will protect the die from external contamination.

Other secondary problems are frequently experienced with polysilicon or metal fuses. The sheet resistance of a doped polysilicon layer is typically in the range 25–60 ohms/square. The power dissipated in the fuse is given by $V^2/R$, where V is the voltage applied to the fuse, and R is the fuse resistance. For typical fuse designs, the voltage V required to generate sufficient heat to destroy the fuse will be higher than the power supplies (2.5–3.3V) used by advanced integrated circuits. This necessitates that an extra programming power supply must be provided, and in some cases, special high voltage transistors must be included in the process to handle this voltage. Such an addition to the process undercuts the whole aim of adding programmability at no extra wafer processing cost.

Metal fuses have the opposite problem. The sheet resistance of the metal is very low (typically 40–80 milliohms/square), and so the whole fuse will have a resistance of less than an ohm. The voltage required for programming will therefore be very low. However, the power dissipation can be given as $I^2*R$, where I is the current passing through the fuse. Due to the low fuse resistance, a very large programming current will be required to dissipate sufficient power to program the fuse. The programming current must be steered to the required fuse by a series of select transistors. In order to accommodate the very high programming current, these select transistors will need to be very large, hence occupying a significant amount of die area, and increasing product cost.

SUMMARY OF THE INVENTION

The present invention, generally speaking provides a static, in-circuit programmable memory device where the storage element employed is a bi-layer programmable resistor. A specialized programming and readout circuit is provided for each storage element, allowing a known word-line/bit-line memory architecture (commonly used with fuse type memories) to be adapted to a memory element that conducts in both of two different states. The programming and readout circuit may take the form of a merged bipolar/FET device. A bipolar transistor is used for programming and also provides a diode action to prevent sneak path currents from flowing when a storage element is not selected. The bipolar transistor may be a parasitic bipolar transistor. An FET is used for readout. Storage elements are paired, one storage element of each pair functioning as a reference element. The bit lines of the paired storage elements are connected to a current mirror circuit that effects a comparison between current through the reference element and current through its paired storage element. Reliable readout is thereby attained.

BRIEF DESCRIPTION OF THE DRAWINGS

The present invention may be further understood from the following description in conjunction with the appended drawing. In the drawing:

FIG. 1 is a top view of a bi-layer programmable resistor;

FIG. 2 is a cross sectional view of the bi-layer programmable resistor of FIG. 1;

FIG. 3 is a schematic of a simplified circuit used to program a bi-layer programmable resistor;

FIG. 4 is a cross sectional view of a bi-layer programmable resistor after being programmed;

FIG. 5 is a schematic of a two-bit by two-bit memory array using programmable resistor elements;

FIG. 6 is a schematic of a two-bit by two-bit memory array with associated programming and readout circuitry;

FIG. 7 is a cross sectional view of a single programming and readout device;

FIG. 8 is a schematic diagram of the device of FIG. 7; and

FIG. 9 is a schematic of a two-bit by two-bit memory array with associated programming and readout circuitry, each access circuit being formed by a single transistor.

DETAILED DESCRIPTION OF THE PREFERRED EMBODIMENTS

FIG. 1 shows a top view of a programmable resistor. The programmable resistor, when programmed, makes a predictable transition from low resistance to medium resistance. This is in contrast to a regular fuse which becomes an open circuit after programming.

From the top view, a layer of silicide 20 is shown. (Herein, silicide is also referred to as metal-silicide.) Silicide layer 20 is the top layer of a bi-layer of material consisting of polysilicon and silicide. A contact 21 and a contact 22 are used to electrically connect the programmable resistor to higher layers.

The programmable resistor is designed to be as small as possible, given the restrictions of the process design rules. This minimizes the thermal mass of the element, and makes it easier to program. The programmable resistor is "necked down" at a region 23 to the minimum width (W) allowed in the design rules. This necking down creates a localized heating at region 23 by dissipating the majority of the power in a small volume. In a typical CMOS process, the resistance of the bi-layer of silicide and polysilicon is typically approximately 10 ohms/square. Thus the total resistance of the programmable resistor shown in FIG. 1 is, for example, approximately 50 ohms.

FIG. 2 shows a cross sectional view of the bi-layer programmable resistor shown in FIG. 1. The programmable resistor is shown to be a bi-layer film consisting of moderately low resistance metal-silicide layer 20 on top of a more highly resistive doped polysilicon layer 28. The programmable resistor may be constructed at any point in the processing of an integrated circuit. However, the bi-layer structure used to form the programmable resistor shown in FIG. 1 is commonly used to create the gate electrode in an advanced CMOS process. Thus, in an advanced CMOS process it is advantageous to form the programmable resistor over field oxide 29 placed over a silicon substrate 30. Inter-level dielectric layers 25, 26 and 27 are placed around the programmable resistor in accordance with conventional integrated circuit processing steps.

Silicide layer 20 is, for example, Tungsten-Silicide approximately 1500 Å thick. Alternatively, the metal used for the metal-silicide composition of silicide layer 20 may consist of, for example, Titanium (Ti), Molybdenum (Mo), Chromium (Cr), Nickel (Ni), Cobalt (Co), or Tantalum (Ta). Polysilicon layer 28 is, for example, 1000 Å thick and doped with Phosphorus.

The sheer resistance of a Tungsten-Silicide layer is, for example, typically 12 ohms/square. By contrast the resistance of a polysilicon layer is, for example, typically 50 to 100 ohms/square (depending on, among other factors, the doping concentration of the Phosphorus within the polysilicon). Thus the resistance of the composite of silicide layer 20 and silicide layer 28 is, for example, approximately 10 ohms/square.

FIG. 3 shows a schematic of a simplified programming circuit 31 used to program a bi-layer programmable resistor 34. Programming circuit 31 includes a voltage source 32 and an output impedance (Rp) 33. Voltage source 32 is, for example, the power supply voltage which is, for example, 3.3 volts, 2.5 volts or some other voltage used as a power supply on an integrated circuit. Programming circuit 31 may be designed in such a fashion as to maintain the voltage across programmable resistor 34 substantially constant during the programming cycle (as opposed to maintaining the current at a constant level). In order for the voltage across the programmable resistor to remain substantially unchanged during the programming event, output impedance 33 of programming circuit 31 is substantially lower than the initial resistance (Rf) of the programmable resistor 34.

For the programmable resistor shown in FIG. 1 and FIG. 2, which has a total resistance of 50 ohms, as discussed above, a programming voltage in the range of 1.7 volts to 2.7 volts is suitable. This voltage is low in comparison to the operating voltage of even the most advanced CMOS integrated circuits, and so represents no special problem in terms of voltage stress on the transistors used in the programming circuitry. Other programming voltages could also be used, for example, voltages within the range 1.2 volts to 3.5 volts. As discussed below, experiments have shown that the final resistance of the programmed resistor shown in FIG. 1 and FIG. 2 is substantially constant for programming voltages in the range 1.7–2.7V and program pulse widths over the range 10 ms to 1s. Output impedance 33 of programming circuit 31 is, for example, in the range of 10 to 25 ohms.

When programming the programmable resistor, a current of 20–30 milliamps (mA) will flow in the programmable resistor. As the resistance of silicide layer 20 is significantly lower than that of underlying polysilicon layer 28, the bulk of the current will be carried by silicide layer 20, and so the heating effects will be concentrated there. Due to the low thermal mass of the programmable resistor, it heats up quickly. The combination of high temperature and high local current flux in region 23 gives rise to rapid electromigration effects in the silicide layer 20. At region 23 there is a net flux of silicide transported along the programmable resistor in the direction of electron flow. In a matter of a few milliseconds, the migration of silicide will become so large that a break will occur in silicide layer 20. This break will most typically occur at one end of region 23, where there is a significant change in the rate of material transport.

After the break in silicide layer 20 is created, the programming current will be forced to flow in underlying polysilicon layer 28. This abrupt transition in the current carrying mechanism of the programmable resistor leads to a significant increase in total resistance. The resistance of the programmable resistor will typically change from approximately 50 ohms to approximately 600 ohms—a factor of 12 increase. Due to the design of programming circuitry 31, as discussed above, the programming voltage across the programmable resistor is maintained substantially constant during this abrupt increase in resistance.

Since the power dissipation in the programmable resistor is equal to the square of the voltage divided by the resistance ($V^2/R$), when the resistance increases by a factor of 12, the power dissipation will drop by a factor of 12. The programming current will likewise drop by a factor of 12. This abrupt decrease in both power dissipation (hence temperature) and programming current will effectively halt the programming mechanism, thus limiting the damage done to the programmable resistor. The final outcome is that the programmable resistor makes a clean transition from a low resistance state to a medium resistance state, without entering into a destructive breakdown mode that is typical of a conventional fuse. As there is no vaporization of the programmable resistor material, the dielectric rupture and reliability problems associated with the prior art fuses are eliminated.

FIG. 4 shows a cross-sectional view of a bi-layer programmable resistor after being programmed. In FIG. 4, a break is shown in silicide layer 20. As illustrated by arrows 41, at the location of the break in silicide 20, current through the programmable resistor is forced to travel through polysilicon layer 28, thus significantly increasing the resistance of resistor 20.

The final resistance state of the programmable resistor is substantially independent of the programming voltage and the programming time. Experiments have shown that the final resistance of the programmed resistor shown in FIG. 1 and FIG. 2 is substantially constant for programming voltages in the range 1.7–2.7V and programmed pulse widths over the range 10 ms to 1s. The insensitivity to the programming conditions is a direct result of the self limiting nature of the programming event when a constant voltage programming pulse is applied.

A two-bit by two-bit memory array of programmable resistor elements of the foregoing type is shown in FIG. 5. Such a memory array, besides being nonvolatile and in-circuit programmable, may be designed to exhibit a number of additional desirable properties, such as high density and high speed. Note, however, that because a conductive path remains through each resistor (no resistors are blown), programming and readout of such a memory array is complicated by the existence of a multitude of "sneak paths." One such sneak path is illustrated in FIG. 5. Word lines run horizontally and bit lines run vertically. When a word line is pulled high, a desired current flows through the resistor and out of a bit line. However, a sneak current also flows through the resistors as shown. In a memory array of any size, a multitude of such sneak paths exist through different combinations of three series resistors. The existence of these sneak paths makes traditional programming and readout mechanisms unworkable.

Referring to FIG. 6, a schematic diagram is shown of a two-bit by two-bit memory array with associated programming and readout circuitry effective to overcome the foregoing problem of sneak paths. A bit cell includes a storage device and a reference device. The reference device may be shared with an adjacent storage device to form a further bit cell. In an exemplary embodiment, each device, whether storage device or reference device, includes a programmable resistor, a bipolar PNP transistor used primarily for programming and a P-channel FET used primarily for readout. A cross-sectional view of such a device (with the programmable resistor omitted) is shown in FIG. 7. The device exhibits radial symmetry dictated by efficiency considerations. The vertical PNP bipolar transistor is a parasitic device that cannot be avoided. The present programming scheme uses this parasitic bipolar transistor to advantage.

A single device is shown in FIG. 8. A first terminal of the programmable resistor is connected through an FET to VDD. A second terminal of the programmable resistor is connected to an emitter of the PNP bipolar transistor. The PNP bipolar transistor has two collectors, a substrate collector and a lateral collector. The substrate collector is connected to ground. A base of the PNP bipolar transistor is connected to a Write Bit line. When the Write Bit line is pulled low, a relatively large programming current (e.g., about 20 mA) flows from VDD through the PNP bipolar transistor to ground. If necessary, the programming current may be increased beyond the current carrying capabilities of the substrate collector alone as will be described.

The P-channel FET is connected between the second terminal of the programmable resistor and a Read Bit line. Because of the merged nature of the FET and bipolar transistors, the gate of the bipolar transistor is in contact with the substrate of the FET transistor. Therefore, when the base of the bipolar transistor is pulled high to VDD, the substrate of the FET is likewise pulled high to VDD as expected for normal operation of the FET. A gate of the FET is connected to a Read Word line. When the Read Word line is pulled low a readout current flows from VDD through the FET and into the Read Word line.

As seen in FIG. 6, Read Word lines of a reference device and a storage device that make up a bit cell are connected in a current mirror configuration. A current mirror is formed by FETs. The channel widths of the FETs are ratioed such that the current mirror has a predetermined current gain. For example, the current gain might be 0.5. The programmable resistor of the reference device remains in its original low impedance state. Assume that the programmable resistor of the storage device is also in the low impedance state. Then if, say, 1 mA flows in the reference device during readout, 0.5 mA will flow in the storage device, producing a relatively high voltage at node A. If the resistor of the storage device is in the high impedance state (e.g., $Z_{hi}=10Z_{lo}$), then 10 times the voltage as before will drop across the programmable resistor, producing a relatively low voltage at node A. The high impedance state may therefore be used to represent a binary 1, and the low impedance state may be used to represent a binary 0.

Referring again to FIG. 7, note that because of the merged structure of the device, the lateral collector of the bipolar transistor is connected to the drain of the FET. If necessary to achieve a sufficiently high programming current, the N-channel FET of FIG. 6 may be turned on such that programming current flows in parallel through the substrate collector and the lateral collector. Alternatively, it may be possible to provide enough current through the base to emitter junction of the bipolar transistor via the Write Bit line to provide the required programming current.

Referring to FIG. 9, by appropriately scaling the FET of the access circuit, its current-handling ability may be increased so as to allow it to carry a current sufficient to achieve programming. The bipolar transistor may then be eliminated. The MOSFET alone is sufficient to eliminate the sneak-path problem previously described. Additional control circuitry is added in the form of a bitline select FET for each bitline, controlled by respective signals BLSEL. To program a resistor 901 for example, three transistors must be turned on: a transistor 903 that gates VDD to the programmable resistor, the access circuit FET 905, and the bitline FET 907.

It will be apparent to those of ordinary skill in the art that the present invention may be embodied in other specific forms without departing from the spirit or essential character thereof. The disclosed embodiments are therefore considered in all respects to be illustrative and not restrictive. The scope of the invention is indicated by the appended claims rather than the foregoing description, and all changes which come within the meaning and range of equivalence thereof are intended to be embraced within.

What is claimed is:

1. A memory apparatus comprising:
   a multiplicity of programmable resistors having at least a low impedance state and a medium impedance state and having first and second terminals, each programmable resistor comprising a layer of doped polysilicon and at least one other layer;
   a multiplicity of word lines and bit lines coupled to said multiplicity of programmable resistors such that first terminals of a plurality of programmable resistors are coupled to a same word line and second terminals of said plurality of programmable resistors are coupled to respective different bit lines;

a multiplicity of access circuits provided in correspondence to said multiplicity of programmable resistors, each of said access circuits comprising a transistor coupled to the second terminal of the corresponding programmable resistor to create a current path to a respective one of said bit lines.

2. The apparatus of claim 1 wherein said transistor is a readout transistor, each of said access circuits further comprising a programming transistor coupled to the second terminal of the corresponding programmable resistor to create a current path to ground.

3. The apparatus of claim 2 wherein said programming transistor is a bipolar transistor.

4. The apparatus of claim 3 wherein said readout transistor is a field effect transistor.

5. The apparatus of claim 4 wherein the programming transistor and the readout transistor are merged in a single device so as to share the same area on an integrated circuit.

6. The apparatus of claim 5 wherein said single device comprises:

a substrate having a first conductivity type;

a diffusion well having a second opposite conductivity type;

within said diffusion well, first and second diffusion regions of said first conductivity type and a third diffusion region of said second conductivity type.

7. The apparatus of claim 6, further comprising:

emitter and collector electrodes connected to respective ones of said first and second diffusion regions;

a base electrode connected to said third diffusion region; and a gate electrode connected in an area between said first and second diffusion regions to define a channel region.

8. The apparatus of claim 2, wherein said programmable resistors are paired to form a plurality of bit cells, each bit cell comprising:

a first programmable resistor in a known impedance state coupled to a first bit line;

a second programmable resistor coupled to a second bit line; and means coupled to the first bit line and the second bit line for producing an indication of the impedance state of the second programmable resistor.

9. The apparatus of claim 8, wherein said means for producing comprises a current mirror.

10. The apparatus of claim 9, wherein the current mirror has a current gain having a value substantially different than unity.

11. A method of accessing a bit cell of a programmable resistor memory, the bit cell including at least one programmable resistor having first and second terminals and an access circuit including a transistor, the method comprising the steps of:

applying a voltage to a first terminal of the programmable resistor;

causing the transistor to conduct; and conducting a programming current through the programmable resistor and through the transistor; wherein said access circuit includes both a bipolar transistor and a field effect transistor wherein a preponderance of said programming current is conducted through the bipolar transistor.

12. The method of claim 11, comprising the further steps of:

applying a voltage to the first terminal of the programmable resistor;

applying a voltage to a gate terminal of the field effect transistor; and conducting a readout current through the programmable resistor and through the field effect transistor.

13. The method of claim 12, wherein said bit cell includes a storage programmable resistor and a reference programmable resistor, and wherein the steps of claim 11 are performed with respect to both the storage programmable resistor and the reference programmable resistor, the method comprising the further step of effecting a relative comparison of a readout current obtained through the storage programmable resistor and a readout current obtained through the reference programmable resistor.

* * * * *